(12) United States Patent
Lee et al.

(10) Patent No.: US 11,974,382 B2
(45) Date of Patent: Apr. 30, 2024

(54) DIELECTRIC SUBSTANCE-ELECTRODE ASSEMBLY AND METHOD OF MANUFACTURING THE SAME

(71) Applicant: KOREA INSTITUTE OF INDUSTRIAL TECHNOLOGY, Cheonan-si (KR)

(72) Inventors: Taeg Woo Lee, Chuncheon-si (KR); O Hyung Kwon, Gangneung-si (KR); Hyung Giun Kim, Gangneung-si (KR)

(73) Assignee: KOREA INSTITUTE OF INDUSTRIAL TECHNOLOGY, Chungcheongnam-do (KR)

( * ) Notice: Subject to any disclaimer, the term of this patent is extended or adjusted under 35 U.S.C. 154(b) by 293 days.

(21) Appl. No.: 17/388,010

(22) Filed: Jul. 29, 2021

(65) Prior Publication Data

US 2022/0166001 A1    May 26, 2022

(30) Foreign Application Priority Data

Nov. 23, 2020    (KR) .................... 10-2020-0158064

(51) Int. Cl.
*H05B 6/62* (2006.01)
*H01M 4/04* (2006.01)
*H05B 6/54* (2006.01)
*H01L 21/683* (2006.01)

(52) U.S. Cl.
CPC ............ *H05B 6/54* (2013.01); *H01M 4/0419* (2013.01); *H01M 4/0423* (2013.01); *H01M 4/0428* (2013.01); *H01M 4/0471* (2013.01); *H05B 6/62* (2013.01); *H01L 21/6833* (2013.01)

(58) Field of Classification Search
CPC ............ H01L 21/6833; H01M 4/0419; H01M 4/0423; H01M 4/0428; H01M 4/0471; H05B 6/54; H05B 6/62; Y02E 60/10

USPC .............. 219/780, 764, 765, 769, 770, 777; 361/502, 503, 508, 509, 526, 519, 520,
(Continued)

(56) References Cited

U.S. PATENT DOCUMENTS

| 3,679,950 A | * | 7/1972 | Rutt | ..................... H01L 23/5383 |
| | | | | 361/321.4 |
| 5,812,366 A | * | 9/1998 | Kuriyama | ................. H01G 9/15 |
| | | | | 361/523 |

FOREIGN PATENT DOCUMENTS

JP        6159982 B2    7/2017

OTHER PUBLICATIONS

Translation of JP6159982B2, Production of an electrostatic chuck, by Proquest document link, Oct. 25, 2023. (Year: 2017).*

* cited by examiner

*Primary Examiner* — Quang T Van
(74) *Attorney, Agent, or Firm* — CANTOR COLBURN LLP

(57) ABSTRACT

Disclosed are a dielectric substance-electrode assembly in which an electrode is coated with a dielectric and a method for manufacturing the same. The dielectric substance-electrode assembly is formed by forming a lower dielectric electrode constituting a lower portion of an assembly body, sealing a capsule filled with a treated powder and a lower dielectric in which an electrode is formed, and forming an upper dielectric constituting an upper portion of the assembly body using the treated powder which is diffused on and bonded to surfaces of the lower dielectric and the electrode due to sintering heat treatment which is performed by applying an isostatic pressure in a state in which the sealed capsule is placed in a pressure vessel of a heat treatment equipment.

25 Claims, 22 Drawing Sheets

(58) Field of Classification Search
USPC ....... 361/522, 523, 525, 528, 529, 532, 537, 361/540
See application file for complete search history.

DIELECTRIC SUBSTANCE-ELECTRODE ASSEMBLY AND METHOD OF MANUFACTURING THE SAME

CROSS-REFERENCE TO RELATED APPLICATION

This application claims priority to and the benefit of Korean Patent Application No, 2020-0158064, filed on Nov. 23, 2020, the disclosure of which is incorporated herein by reference in its entirety.

BACKGROUND

1. Field of the Invention

The present invention relates to a dielectric substance-electrode assembly in which a capsule filled with a treated powder and a lower dielectric, in which an electrode is formed, is sealed, sintering heat treatment is performed by applying an isostatic pressure in a state in which the sealed capsule is placed in a pressure vessel of a heat treatment equipment, the treated powder is diffused on and bonded to surfaces of the lower dielectric and the electrode due to the sintering heat treatment so as to form an upper dielectric, and thus the electrode is buried and installed between the lower dielectric and the upper dielectric, and a method of manufacturing the same.

2. Discussion of Related Art

A dielectric substance-electrode assembly, for example, an electrostatic chuck (ESC) used in plasma environments for semiconductor and display manufacturing processes employs a ceramic material with a high inciting point and excellent durability. As the density of plasma is increasing due to the demand for high integration, for the ESC used in a plasma environment, the need for the development of a ceramic material with characteristics of excellent plasma etch resistance and generation of less contaminants is emerging.

Patent Document 1 discloses a method of manufacturing an ESC formed of alumina and supporting a suctioned part in a semiconductor manufacturing process according to the related art. Patent Document 1 discloses a technique for applying a process of heating two alumina plates with an electrode and a bonding material interposed therebetween at 1400° C. or higher or for performing heat treatment through hot press sintering at 1400° C. or higher by burying an electrode in an alumina powder.

RELATED ART DOCUMENT

Patent Document (Patent Document 1) Japanese Patent Registration No. 10-6159982 (registered on Jun. 23, 2017)
[Non-Patent Document]
(Non-Patent Document) No

SUMMARY OF THE INVENTION

As shown in FIG. 1A, according to a sintering method applied to Patent Document 1, closed pores P1 remain between alumina plates, and the closed pores P1 formed between alumina particles cause electrical breakdown during an operation of an electrostatic chuck (ESC), and thus there is a problem in that the closed pores P1 become a fatal obstacle. In addition, as shown in FIGS. 1B and 1C, defects P2 and P3 occur in a bonding surface between the buried electrode and the alumina.

The present invention is directed to a dielectric substance-electrode assembly in which a capsule filled with a treated powder and a lower dielectric, in which an electrode is formed, is sealed, sintering heat treatment is performed by applying an isostatic pressure in a state in which the sealed capsule is placed in a pressure vessel of a heat treatment equipment, the treated powder is diffused on and bonded to surfaces of the lower dielectric and the electrode due to the sintering heat treatment so as to form an upper dielectric, and thus the electrode is buried and installed between the lower dielectric and the upper dielectric so that the dielectric substance-electrode assembly has an excellent interface characteristic and high plasma resistance while suppressing internal pores remaining therein due to the applied heat and isostatic pressure, and a method of manufacturing the same.

According to an aspect of the present invention, there is provided a dielectric substance-electrode assembly including an electrode coated with a dielectric, which includes a lower dielectric forming a lower portion of an assembly body, an electrode formed in the lower dielectric, and an upper dielectric forming an upper portion of the assembly body using a treated powder which is diffused on and bonded to surfaces of the lower dielectric and the electrode due to sintering heat treatment which is performed by simultaneously applying heat and an isostatic pressure in a state in which a capsule filled with the treated powder and the lower dielectric, in which the electrode is formed, is sealed and the sealed capsule is placed in a pressure vessel of a heat treatment equipment.

In addition, the lower dielectric and the upper dielectric may be formed of the same material, and the treated powder may be prepared by compressing and molding a powder of the same material as the lower dielectric.

In addition, an average particle diameter (D50) of the treated powder may range from 0.1 μm to 100 μm.

In addition, the isostatic pressure applied to the capsule in the pressure vessel may range from 1000 bar to 3000 bar.

In addition, a temperature of the sintering heat treatment performed on the capsule may range from 1300° C. to 1700° C., and a heat treatment time may be 30 minutes or more.

In addition, each of the lower dielectric and the upper dielectric may include any one material among $Al_2O_3$, MgO, $Zr_2O_3$, $Zn_2O$, $Y_2O_3$, $SiO_2$, AlN, and $Si_3N_4$, or a ceramic material made of a mixture of two or more thereamong.

In addition, any one material among CaO, $Fe_2O_3$, Si, Ca, TiC, Fe, and Ti or a sintering aid made of a mixture of two or more thereamong may be added to each of the lower dielectric and upper dielectric within 30 wt %.

In addition, the electrode may be any one material among Ag, Pd, Pt, and W or a metal mixture of two or more thereamong.

In addition, the electrode may have a thickness ranging from 2 μm to 10 μm.

In addition, the electrode may be formed in the lower dielectric using any one method among a screen printing method, a drop casting method, a physical vapor deposition (PVD) method, a chemical vapor deposition (CVD) method, and a thermal spraying coating method.

In addition, the heat treatment equipment may include a pressure vessel forming an accommodation space, an upper cover which blocks an open upper portion of the pressure vessel and in which a gas inlet through which gas is introduced into the accommodation space is formed, a lower cover configured to block an open lower portion of the pressure vessel, an insulating member provided inside the pressure vessel, a heater configured to heat the accommodation space surrounded by the insulating member, and a support configured to support the capsule.

In addition, when a plurality of lower dielectrics, in which the electrode is formed, are stacked and disposed in the capsule at regular intervals and the treated powder fills a space between the plurality of lower dielectrics spaced apart from each other, stepped portions may be formed on side surfaces of the plurality of lower dielectrics so that dividing grooves, which are empty without being filled with the treated powder, may be formed.

In addition, the dielectric substance-electrode assembly may be any one of an electrostatic chuck (ESC) and an electrode heater buried-type ceramic member.

According to another aspect of the present invention, there is provided a method of manufacturing a dielectric substance-electrode assembly which includes forming a lower dielectric of an assembly body, forming an electrode in the lower dielectric, and forming an upper dielectric of the assembly body, wherein, in the forming of the upper dielectric, the electrode is buried and installed between the lower dielectric and the upper dielectric by sealing the capsule filled with the treated powder and the lower dielectric on which the electrode is formed, performing sintering heat treatment by applying an isostatic pressure in a state in which the sealed capsule is placed inside a pressure vessel of a heat treatment equipment, and diffusing and bonding the treated powder on and to a surface of the lower dielectric and the electrode due to the sintering heat treatment.

In addition, the lower dielectric and the upper dielectric may be formed of the same material, and the treated powder may be prepared by compressing and molding a powder of the same material as the lower dielectric.

In addition, an average particle diameter (D50) of the treated powder may range from 0.1 μm to 100 μm.

In addition, the isostatic pressure applied to the capsule in the pressure vessel may range from 1000 bar to 3000 bar, a temperature of the sintering heat treatment performed on the capsule may range from 1300° C. to 1700° C., and a heat treatment time may be 30 minutes or more.

In addition, each of the lower dielectric and the upper dielectric may include any one material among $Al_2O_3$, MgO, $Zr_2O_3$, $Zn_2O$, $Y_2O_3$, $SiO_2$, AlN, and $Si_3N_4$, or a ceramic material made of a mixture of two or more thereamong.

In addition, any one material among CaO, $Fe_2O_3$, Si, Ca, TiC, Fe, and Ti or a sintering aid made of a mixture of two or more thereamong may be added to each of the lower dielectric and upper dielectric within 30 wt %.

In addition, in the forming of the electrode, a concave groove corresponding to a shape of the electrode may be formed in the lower dielectric, and the electrode may be installed in the concave groove.

In addition, the concave groove may be formed as a circular plate-shaped groove or a ring-shaped groove, and the concave groove may be recessed to a predetermined depth corresponding to a thickness of the electrode and may have a diameter that is smaller than a diameter of the lower dielectric.

In addition, in the forming of the electrode, the electrode may be formed to protrude from the surface of the lower dielectric.

In addition, the forming of the electrode may be performed using any one method among a screen printing method, a drop casting method, a PVD method, a CVD method, and a thermal spraying coating method.

In addition, the electrode may be any one material among Ag, Pd, Pt, and W or a metal mixture of two or more thereamong and may have a thickness ranging from 2 μm to 10 μm.

In addition, in the forming of the upper dielectric, when a plurality of lower dielectrics, in which the electrode is formed, are stacked and disposed in the capsule at regular intervals and the treated powder fills a space between the plurality of lower dielectrics spaced apart from each other, stepped portions may be formed on side surfaces of the plurality of lower dielectrics so that dividing grooves, which are empty without being filled with the treated powder, may be formed.

In addition, the method may further include cutting a sintered body undergoing the sintering process in the heat treatment equipment to form the assembly body.

In addition, the method may further include forming a through-hole in the lower dielectric to partially expose the electrode buried and installed between the lower dielectric and the upper dielectric and installing an electrode rod for electrical connection to the electrode in the through-hole to form a contact portion.

In addition, the dielectric substance-electrode assembly may be any one of an ESC and an electrode heater buried-type ceramic member.

BRIEF DESCRIPTION OF THE DRAWINGS

The above and other objects, features and advantages of the present invention will become more apparent to those skilled in the art by describing exemplary embodiments thereof in detail with reference to the accompanying drawings, in which.

DETAILED DESCRIPTION OF EXEMPLARY EMBODIMENTS

According to the present invention, a process of installing an electrode in a lower dielectric is preferentially performed and, distinctively, a capsule is filled with a lower dielectric and a treated powder and sealed, and then a heat treatment method of forming an upper dielectric using a hot isostatic pressing (HIP) is applied.

Figure 1A:
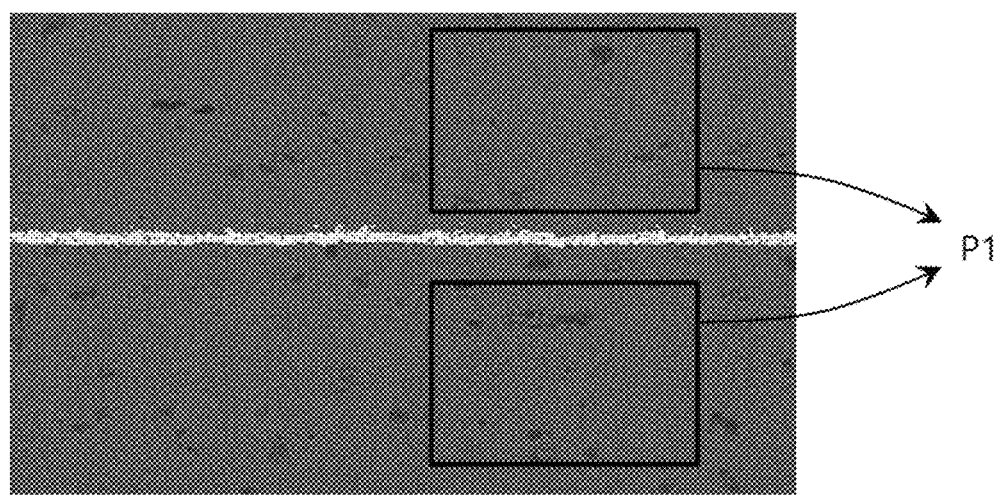
FIG. 1A to FIG. 1C show enlarged images illustrating microstructures of a sintered body according to a related art.
Figure 1B:
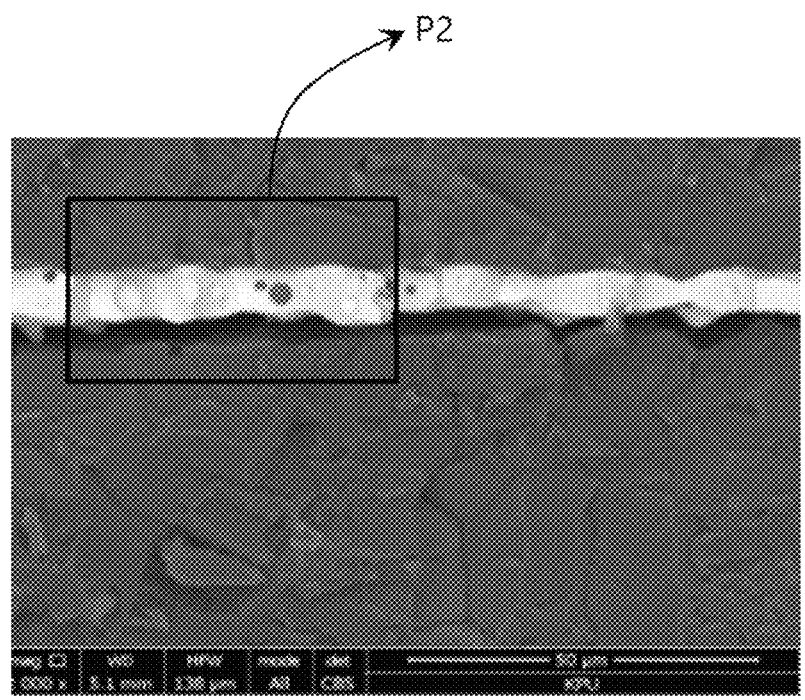
Figure 1C:
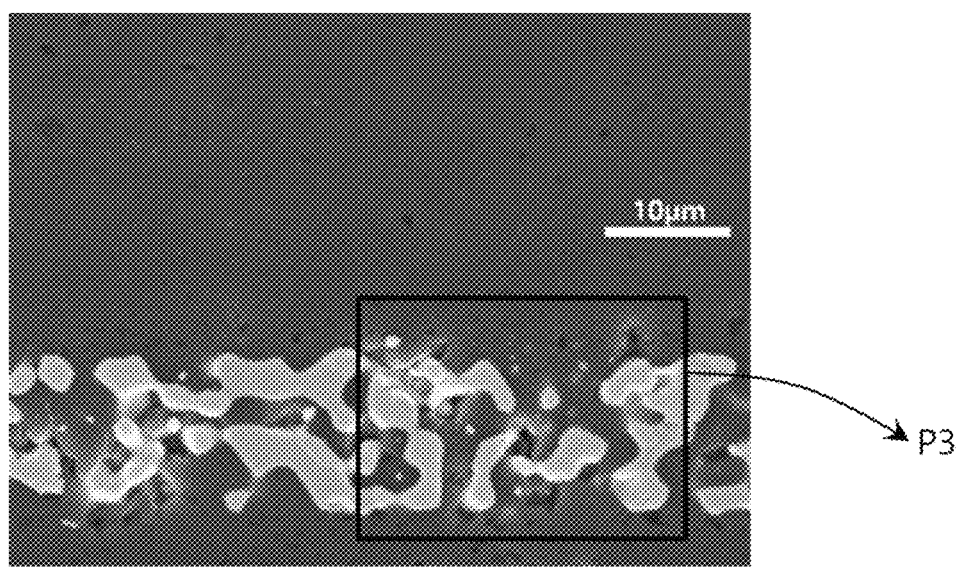
Figure 2:
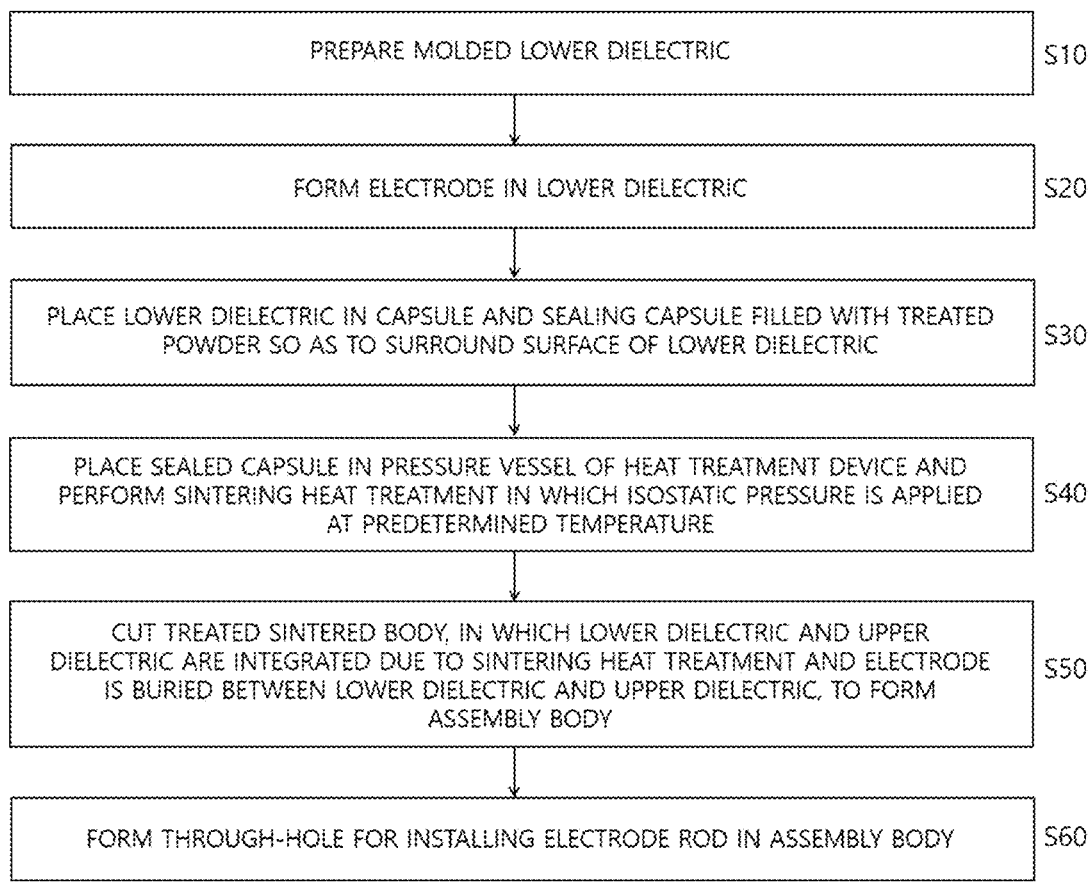
FIG. 2 is a flowchart illustrating a method of manufacturing an electrostatic chuck (ESC) according to an embodiment of the present invention.

Referring to FIG. 2, a method of manufacturing a dielectric substance-electrode assembly according to an embodiment of the present invention includes a series of processes of preparing a molded lower dielectric (S10), forming an electrode in the lower dielectric (S20), filling the capsule with the lower dielectric and a treated powder and sealing the capsule (S30), placing the sealed capsule in a pressure vessel of a heat treatment equipment and performing sintering process by applying heat and an isostatic pressure (S40), cutting a treated sintered body undergoing the sintering heat treatment to form an assembly body (S50), and forming a through-hole in the lower dielectric of the assembly body (S60).

Hereinafter, exemplary embodiments of the present invention will be described in detail with reference to the accompanying drawings.

First Embodiment

Figure 3:
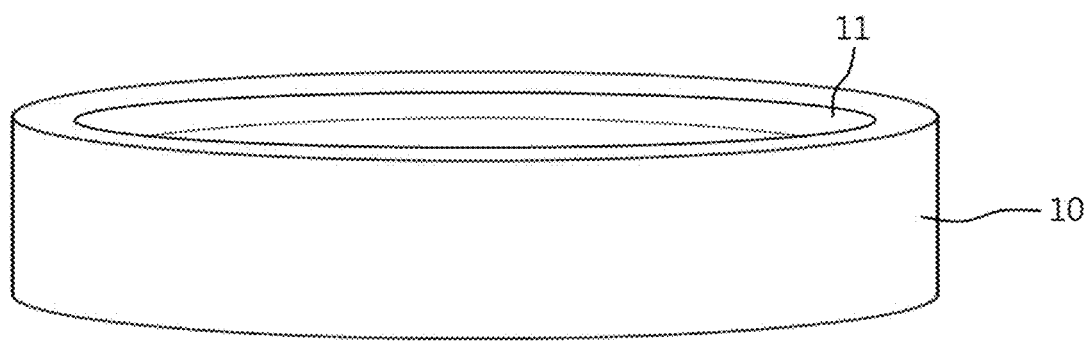
FIG. 3 is a perspective view illustrating an exterior of a lower dielectric in which a circular plate-shaped groove is formed according to an embodiment of the present invention.
Figure 4:
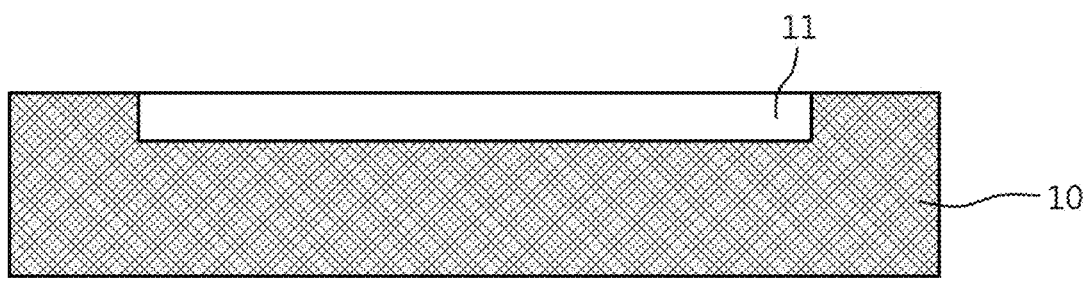
FIG. 4 is a cross-sectional view illustrating the circular plate-shaped groove formed in the lower dielectric of FIG. 3.

Referring to FIGS. 3 and 4, a lower dielectric 10 molded in the form of a flat plate is prepared. The lower dielectric 10 pray be made of any one material among aluminum oxide ($Al_2O_3$), magnesium oxide (MgO), zirconium oxide ($Zr_2O_3$), zinc suboxide ($Zn_2O$), yttrium oxide ($Y_2O_3$), silicon dioxide ($SiO_2$), aluminum nitride (AlN), and silicon nitride ($Si_3N_4$) or a ceramic material made of a mixture of two or more thereamong. In addition, in order to enhance electrical and mechanical characteristics of the ceramic material, any one material among calcium oxide (CaO), ferric oxide ($Fe_2O_3$), Si, Ca, titanium carbide (TiC), Fe, and Ti or a sintering aid made of a mixture of two or more thereamong may be added to the lower dielectric 10 within 30 wt %.

A concave groove is formed in an upper surface of the lower dielectric 10 through machining so as to install an electrode. The concave groove may be formed as a circular plate-shaped groove 11 recessed in the lower dielectric 10 by as much as a thickness of the electrode. The circular plate-shaped groove 11 has a diameter that is smaller than a diameter of the lower dielectric 10.

Figure 5:
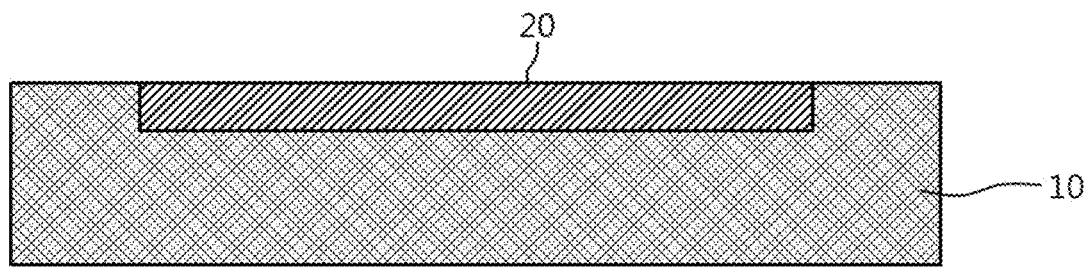
FIG. 5 is a cross-sectional view illustrating an electrode formed in the circular plate-shaped groove of the lower dielectric of FIG. 4.

Referring to FIG. 5, the circular plate-shaped groove 11 is filled with an electrode 20, and the electrode 20 is fixedly installed in the circular plate-shaped groove 11. The electrode 20 may be made of any one material among Ag, Pd, Pt, and W or a metal mixture of two or more thereamong, and the electrode 20 may be formed to have a thickness ranging from 2 µm to 10 µm. The upper surface of the lower dielectric 10 in which the electrode 20 is installed in the circular plate-shaped groove 11 is planarized.

Figure 6:
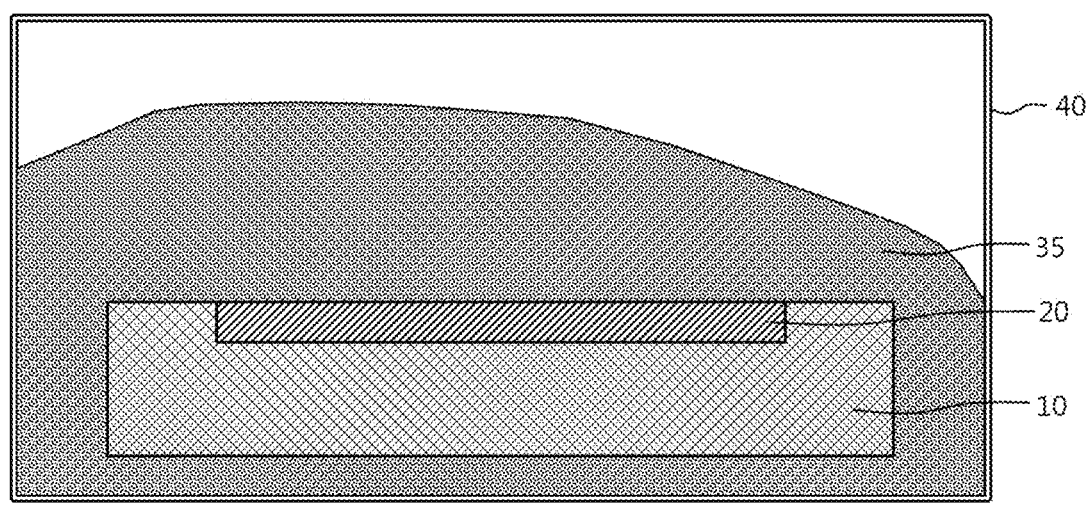
FIG. 6 is a cross-sectional view illustrating a capsule filled with the lower dielectric of FIG. 5 and a treated powder.

Referring to FIG. 6, the lower dielectric 10, in which the electrode 20 is formed, is put into a capsule 40, a treated powder 35 fills the capsule 40 to surround the entirety of outer surfaces of the lower dielectric 10 and the electrode 20, and then the capsule 40 is sealed. The capsule 40 may be formed of a metal, glass or a thermally conductive material including ceramics.

A treated powder 35 is prepared by compressing and molding a powder of the same material as the lower dielectric 10, and an average particle diameter (D50) of the treated powder 35 ranges from 0.1 µm to 100 µm. For example, the treated powder 35 may be made of any one material among $Al_2O_3$, MgO, $Zr_2O_3$, $Zn_2O$, $Y_2O_3$, $SiO_2$, AlN. and $Si_3N_4$ or a ceramic material made of a mixture of two or more thereamong by forming the material or the ceramic material in the form of a powder. In addition, in order to enhance electrical and mechanical characteristics of the ceramic material, any one material among CaO, $Fe_2O_3$, Si, Ca, TIC, Fe, and Ti or a sintering aid made of a mixture of two or more thereamong may be added to the treated powder 35 within 30 wt %.

Figure 7:
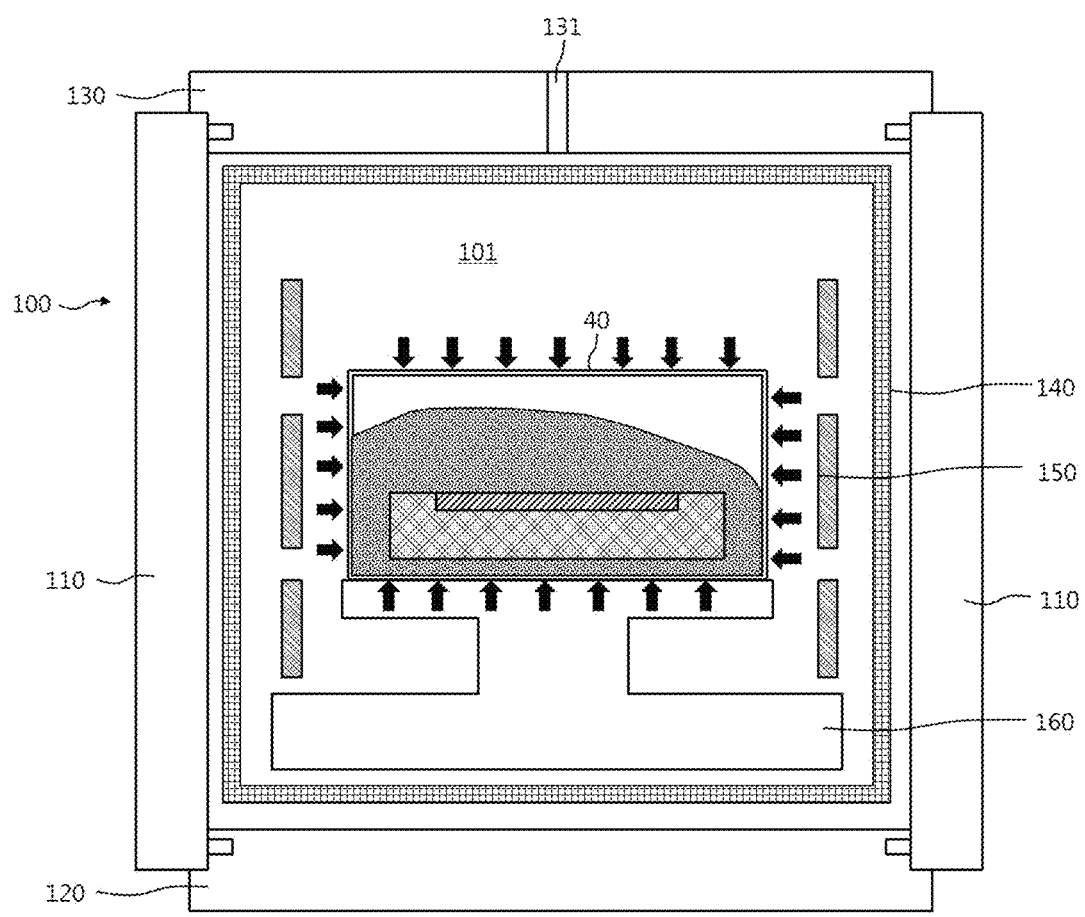
FIG. 7 is a cross-sectional view illustrating that the capsule of FIG. 6 is disposed in a heat treatment equipment according to an embodiment of the present invention.

Referring to FIG. 7, the sealed capsule 40 is installed in a heat treatment equipment 100.

The heat treatment equipment 100 includes a pressure vessel 110, a lower cover 120, and an upper cover 130 for forming a cylindrical reaction chamber.

The pressure vessel 110 forms an accommodation space 101, the upper cover 130 is installed to be opened and closed to cover an open upper portion of the pressure vessel 110, and the lower cover 120 is installed to be opened and closed to cover an open lower portion of the pressure vessel 110. A gas inlet 131 through which a gas is introduced into the accommodation space 101 is formed in the upper cover 130. Inert gases such as Argon (Ar), Nitrogen ($N_2$), or a mixture gas of two or more thereamong may be supplied as a pressure medium through the gas inlet 131, and thus an isostatic pressure may be applied to the capsule 40. The isostatic pressure applied to the capsule 40 ranges from 1000 bar to 3000 bar.

A support 160 for supporting the sealed capsule 40 is included inside the pressure vessel 110. A through-hole through which a gas may be introduced is formed in an upper surface of the support 160 to apply an isostatic pressure to a lower surface of the capsule 40.

An insulating member 140 and a heater 150 are installed inside the pressure vessel 110. The heater 150 may heat the accommodation space 101 surrounded by the insulating member 140 to form a temperature of a sintering heat treatment process. A temperature of sintering heat treatment performed on the capsule 40 ranges from 1300° C. to 1700° C., and a heat treatment time is 30 minutes or more.

When the sintering heat treatment is completed in the pressure vessel 110 of the heat treatment equipment 100, the upper cover 130 is opened and the sealed capsule 40 is unloaded and disassembled. A treated sintered body in which the treated powder 35 is bonded to the lower dielectric 10 and the electrode 20 due to the sintering heat treatment is unloaded from the capsule 40, and then the treated sintered body is cut using a cutting tool to form a chuck body 1.

Figure 8:
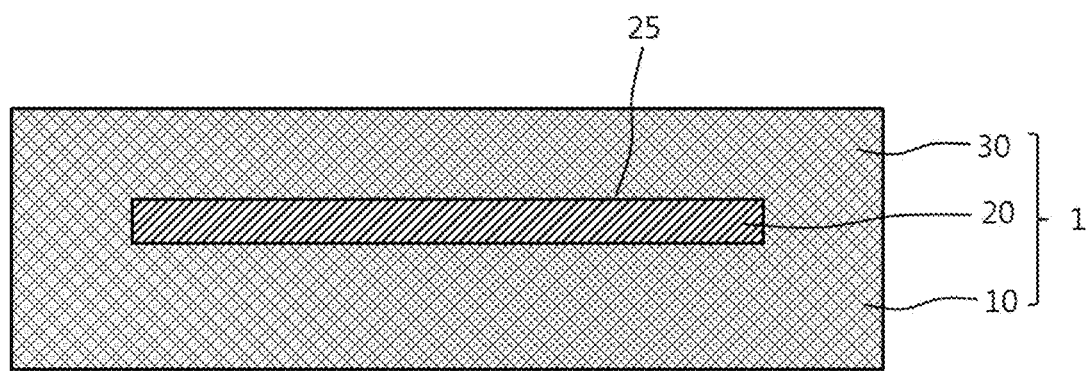
FIG. 8 is a cross-sectional view illustrating a chuck body obtained by heat-treating and post-processing the capsule of FIG. 5 using the heat treatment equipment.

As shown in FIG. 8, after the cutting process is completed, the chuck body 1 has a structure in which the electrode 20 is buried between the lower dielectric 10 and the upper dielectric 30, and the structure is implemented such that the treated powder 35 is diffused on and bonded to the surfaces of the lower dielectric 10 and the electrode 20 due to the sintering heat treatment so as to form the upper dielectric 30 forming an upper portion of the chuck body 1. As described above, due to the performance of the sintering heat treatment by applying the isostatic pressure, an interface 25 between the electrode 20 and the upper dielectric 30 has an excellent interface characteristic.

Figure 9:
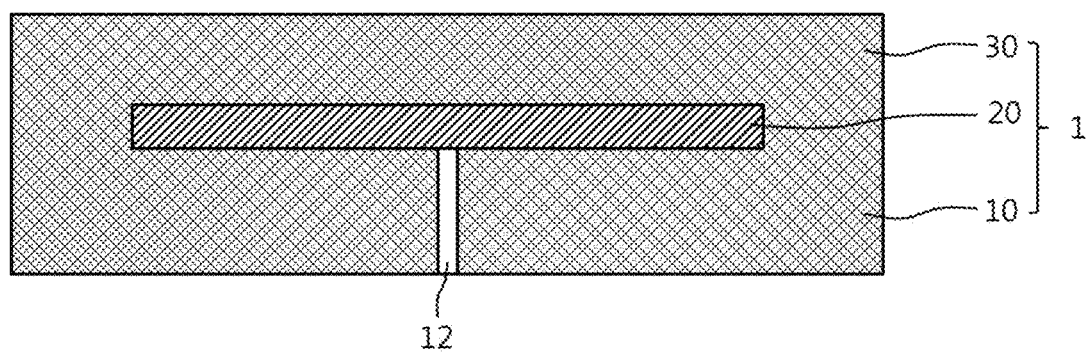
FIG. 9 is a cross-sectional view illustrating that a through-hole is formed in the lower dielectric of the chuck body of FIG. 8.
Figure 10:
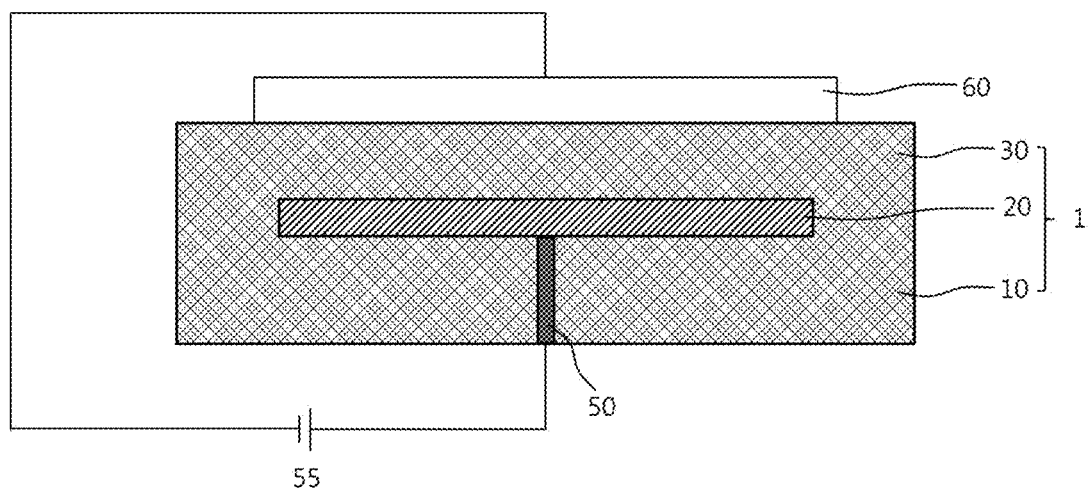
FIG. 10 is a diagram illustrating an ESC in which a contact portion of the chuck body of FIG. 9 is connected to a power source.

Thereafter, as shown in FIG. 9, a through-hole 12 is formed in the lower dielectric 10 so as to partially expose the electrode 20 buried and installed between the lower dielectric 10 and the upper dielectric 30. Then, as shown in FIG. 10, an electrode rod is installed in the through-hole 12 to form a contact portion 50, and a power source 55 is connected to the contact portion 50. Accordingly, an operation of the ESC for suctioning and fixing a workpiece 60 (a wafer or a glass substrate) placed on a surface of the upper dielectric 30 using an electrostatic force may be performed.

Second Embodiment

According to the present invention, a capsule is filled with a lower dielectric and a treated powder and sealed, and then a heat treatment method of forming an upper dielectric using an HIP is applied. It is possible to mass-produce ESC products such that a plurality of lower dielectrics are disposed to be spaced apart from each other inside a capsule, a treated powder fills a space between the plurality of lower dielectrics to obtain a lump of treated sintered body through a one-time heat treatment process, and then a post-process of dividing the lump of treated sintered body into individual chuck bodies is performed. A method of manufacturing an ESC related to the above description will be described.

Figure 11:
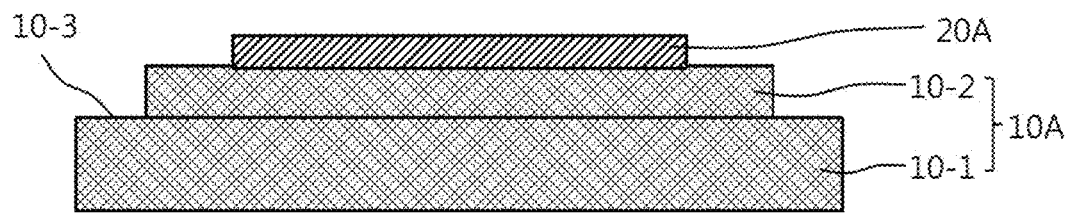
FIG. 11 is a cross-sectional view illustrating that an electrode is formed in a lower dielectric according to another embodiment of the present invention.

Referring to FIG. 11, a lower dielectric 10A molded in a step form is prepared. A lower dielectric 10A may be made of any one material among $Al_2O_3$, MgO, $Zr_2O_3$, $Zn_2O$, $Y_2O_3$, $SiO_2$, AlN, and $Si_3N_4$ or a ceramic material made of a mixture of two or more thereamong. In addition, in order to enhance electrical and mechanical characteristics of the ceramic material, any one material among CaO, $Fe_2O_3$, Si, Ca, TiC, Fe, and Ti or a sintering aid made of a mixture of two or more thereamong may be added to the lower dielectric 10A within 30 wt %.

The lower dielectric 10A according to the embodiment is formed such that a flat portion 10-2 is stacked on a bottom portion 10-1. The flat portion 10-2 is formed to have a relatively short length in a horizontal direction. A stepped portion 10-3 is formed between a side surface of the bottom portion 10-1 and a side surface of the flat portion 10-2.

An electrode 20A is formed on an upper surface of the lower dielectric 10A.

The electrode 20A may be formed on the upper surface of the lower dielectric 10A using any one method among a screen printing method, a drop casting method, a physical vapor deposition (PVD) method, a chemical vapor deposition (CVD) method, and a thermal spraying coating method. The electrode 20A may be made of any one material among Pd, Pt, and W or a metal mixture of two or more thereamong, and the electrode 20A may be formed to have a thickness ranging from 2 μm to 10 μm.

Figure 12:
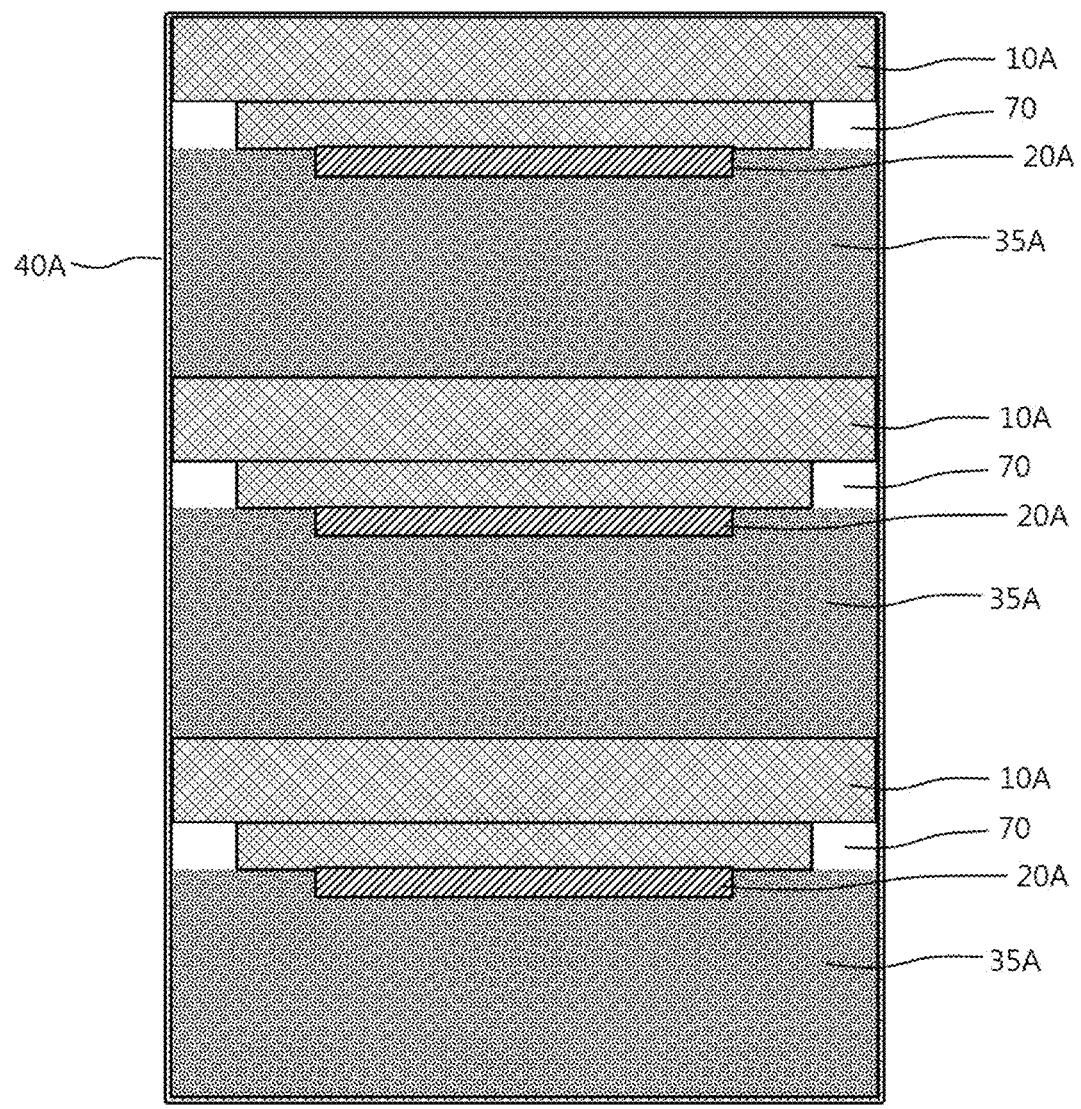
FIG. 12 is a cross-sectional view illustrating that a plurality of lower dielectrics of FIG. 11 are disposed to be spaced apart from each other inside a capsule and treated powders fill a space between the plurality of lower dielectrics.

As shown in FIG. 12, in order to mass-produce a chuck body of the ESC through a one-time heat treatment process, a plurality of lower dielectrics 10A are disposed to be spaced apart from each other in an extended capsule 40A having an increased internal volume. The extended capsule 40A may be formed of a metal, glass or a thermally conductive material including ceramics.

A treated powder 35A and the lower dielectric 10A are alternately stacked and disposed in an upward direction from a bottom of the extended capsule 40A. In this case, as the electrode 20A of the lower dielectric 10A, of which an upper surface and a lower surface are switched, is disposed to face the treated powder 35A below, the protruding electrode 20A and one surface of the lower dielectric 10A come into contact with the treated powder 35A. In particular, the entirety of an outer surface of the electrode 20A is buried in the treated powder 35A.

As a resultant in which sintering heat treatment is performed in a state in which the treated powder 35A fills a space between the plurality of lower dielectrics 10A spaced apart from each other, a lump of treated sintered body may be obtained. In this case, when the plurality of lower dielectrics 10A are stacked in the extended capsule 40A, a plurality of dividing grooves 70 are formed on side surfaces of the lower dielectrics 10A as empty gaps without being filled with the treated powder 35A. Accordingly, even when the plurality of lower dielectrics 10A which are vertically stacked are coupled as one lump via the treated powder 35A, the plurality of dividing grooves 70 in the form of being dug in an outer surface of the one lump of treated sintered body may be discriminated, and each chuck body may be easily separated by performing post-processing based on the plurality of dividing grooves 70.

The treated powder 35A is prepared by compressing and molding a powder of the same material as the lower dielectric IDA, and an average particle diameter (D50) of the treated powder 35A ranges from 0.1 μm to 100 μm. For example, the treated powder 35A may be made of any one material among $Al_2O_3$, MgO, $Zr_2O_3$, $Zn_2O$, $Y_2O_3$, $SiO_2$, AlN, and $Si_3N_4$ or a ceramic material made of a mixture of two or more thereamong by forming the material or the ceramic material in the form of a powder. In addition, in order to enhance electrical and mechanical characteristics of the ceramic material, any one material among CaO, $Fe_2O_3$, Si, Ca, TiC, Fe, and Ti or a sintering aid made of a mixture of two or more thereamong may be added to the treated powder 35A within 30 wt %.

Figure 13:
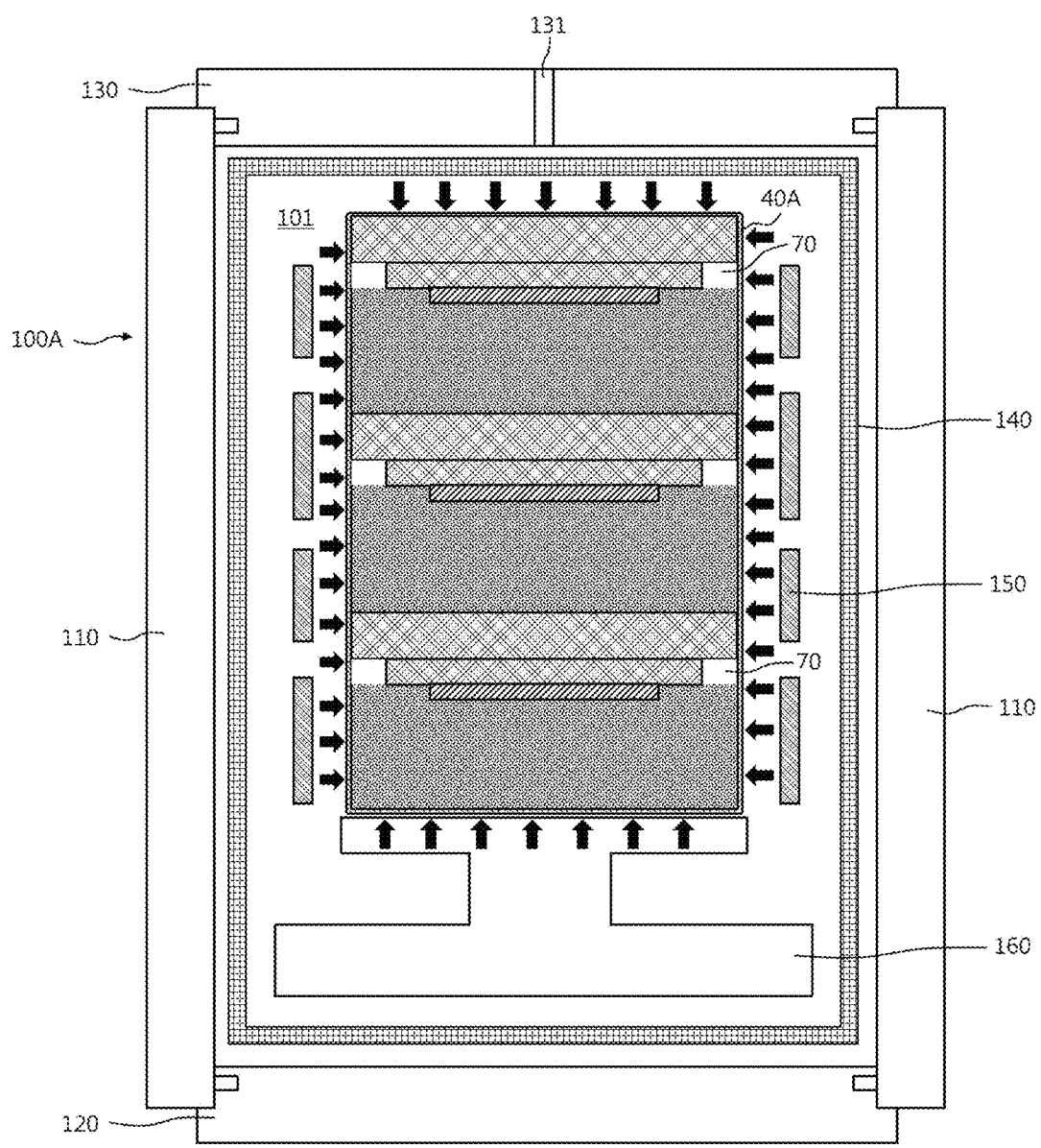
FIG. 13 is a cross-sectional view illustrating that the capsule of FIG. 12 is disposed in a heat treatment equipment according to another embodiment of the present invention.

Referring to FIG. 13, the sealed extended capsule 40A is installed in a heat treatment equipment 100A. The heat treatment equipment 100A is a component that is functionally the same as the above described heat treatment equipment 100 of FIG. 7 and may include a pressure vessel 110, a lower cover 120, and an upper cover 130 tier forming a cylindrical reaction chamber.

The pressure vessel 110 forms an accommodation space 101, the upper cover 130 is installed to be opened and closed to cover an open upper portion of the pressure vessel 110, and the lower cover 120 is installed to be opened and closed to cover an open lower portion of the pressure vessel 110. A gas inlet 131 through which gas is introduced into the accommodation space 101 is formed in the upper cover 130. Ar, $N_2$, or a mixture gas of two or more thereamong may be is supplied as a pressure medium through the gas inlet 131, and thus an isostatic pressure may be applied to the extended capsule 40A. The isostatic pressure applied to the extended capsule 40A ranges from 1000 bar to 3000 bar.

A support 160 for supporting the sealed extended capsule 40A is included inside the pressure vessel 110. A throughhole through which gas may be introduced is formed in an upper surface of the support 160 to apply an isostatic pressure to a lower surface of the extended capsule 40A.

An insulating member 140 and a heater 150 are installed inside the pressure vessel 110. The heater 150 may heat the accommodation space 101 surrounded by the insulating member 140 to form a temperature of a sintering heat treatment process. A temperature of sintering heat treatment performed on the extended capsule 40A ranges from 1300° C. to 1700° C., and a heat treatment time is 30 minutes or more.

When the sintering heat treatment is completed in the pressure vessel 110 of the heat treatment equipment 100, the upper cover 130 is opened and the sealed extended capsule 40A is unloaded and disassembled. A treated sintered body in which the treated powder 35 is bonded to the lower dielectric 10 and the electrode 20 due to the sintering heat treatment is unloaded from the extended capsule 40A, and then the treated sintered body is cut using a cutting tool to form each chuck body 1A.

Figure 14:
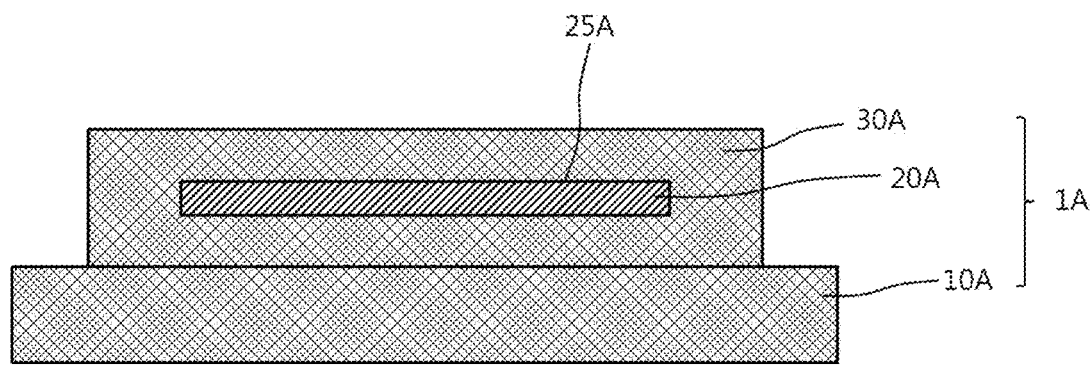
FIG. 14 is a cross-sectional view illustrating a chuck body obtained by heat-treating and post-processing the capsule of FIG. 12 using the heat treatment equipment of FIG. 13.

As shown in FIG. 14, after the cutting process is completed, each chuck body 1A has a structure in which the electrode 20A is buried between the lower dielectric 10A and the upper dielectric 30A, and the structure is implemented such that the treated powder 35A is diffused on and bonded to the surfaces of the lower dielectric 10 and the electrode 20 due to the sintering heat treatment so as to form the upper dielectric 30A forming an upper portion of each chuck body 1A. As described above, due to the performance of the sintering heat treatment by applying the isostatic pressure, an interface 25A between the electrode 20A and the upper dielectric 30A has an excellent interface characteristic.

Figure 15:
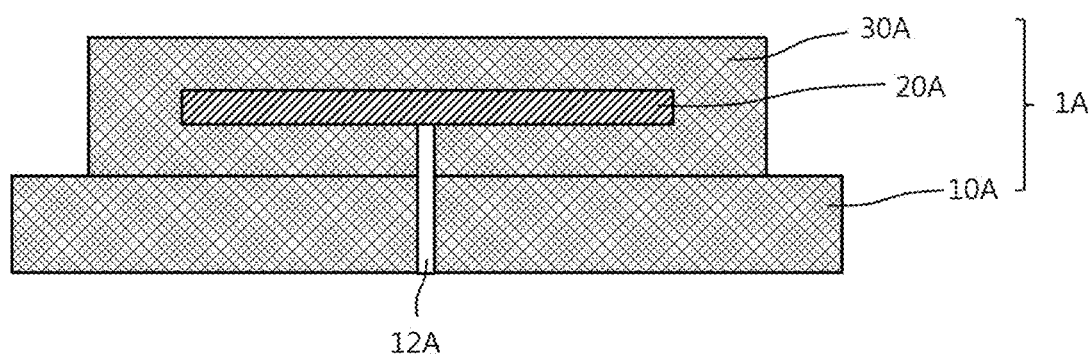
FIG. 15 is a cross-sectional view illustrating that a through-hole is formed in the lower dielectric of the chuck body of FIG. 14.
Figure 16:
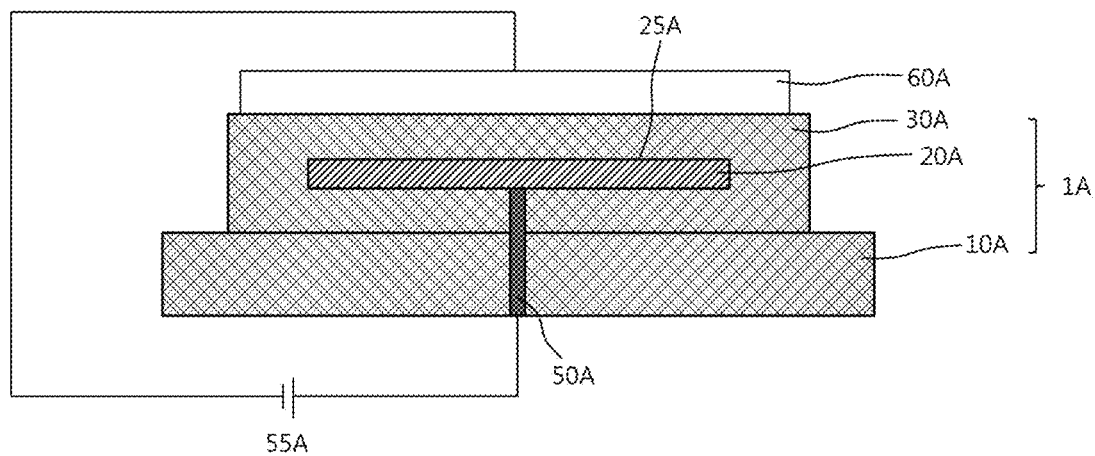
FIG. 16 is a diagram illustrating an ESC in which a contact portion of the chuck body of FIG. 15 is connected to a power source.

Thereafter, as shown in FIG. 15, a through-hole 12A is formed in the lower dielectric 10A so as to partially expose the electrode 20A buried and installed between the lower dielectric 10A and the upper dielectric 30A. Then, as shown in FIG. 16, an electrode rod is installed in the through-hole 12A to form a contact portion 50A, and a power source 55A is connected to the contact portion 50A. Accordingly, an operation of the ESC for suctioning and fixing a workpiece 60A (a wafer or a glass substrate) placed on a surface of the upper dielectric 30A using an electrostatic force may be performed.

Third Embodiment

According to the present invention, a capsule is filled with a lower dielectric and a treated powder and sealed, and then a heat treatment method of forming an upper dielectric using an HIP is applied. Unlike the above described first embodiment, an electrode pattern formed on a lower dielectric may be modified, and to this end, a shape of a concave groove formed in the lower dielectric may be formed to correspond to the deformed electrode pattern, and a method of manufacturing an ESC related to the above description will be described.

Except for a configuration in which an electrode pattern is modified, the remaining configurations in the third embodiment may be applied in the same manner as in the first embodiment.

Figure 17:
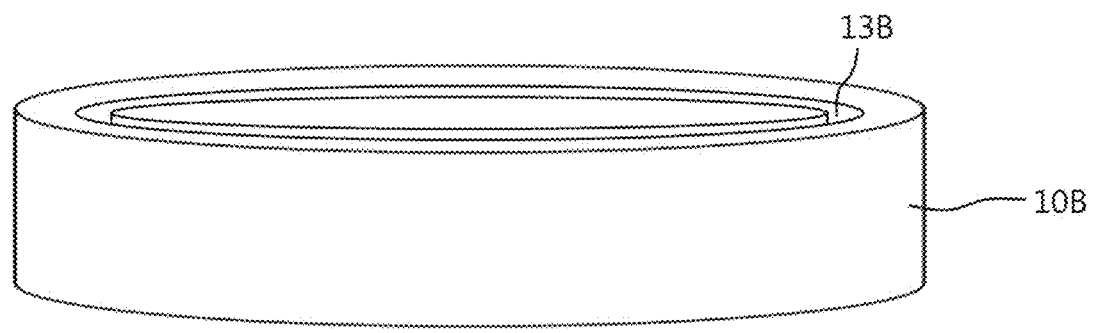
FIG. 17 is a perspective view illustrating an exterior of a lower dielectric in which a ring-shaped groove is formed according to another embodiment of the present invention.
Figure 18:
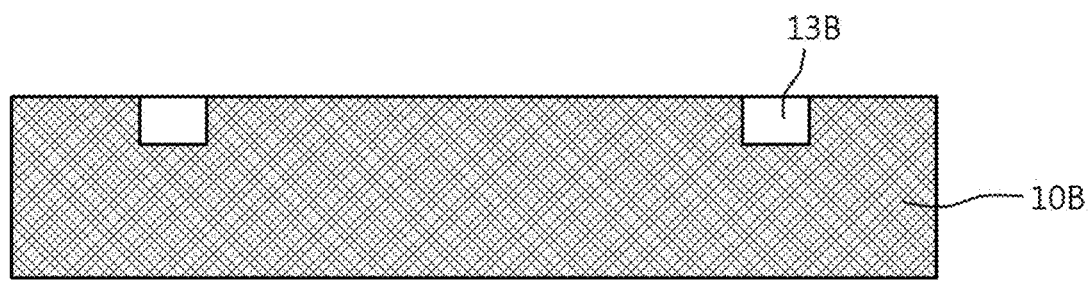
FIG. 18 is a cross-sectional view illustrating that the ring-shaped groove is formed in an upper surface of the lower dielectric of FIG. 17.

Referring to FIGS. 17 and 18, a lower dielectric 10B molded in the form of a flat plate is prepared. A lower dielectric 10B may be made of any one material among $Al_2O_3$, MgO, $Zr_2O_3$, $Zn_2O$, $Y_2O_3$, $SiO_2$, AlN, and $Si_3N_4$ or a ceramic material made of a mixture of two or more thereamong. In addition, in order to enhance electrical and mechanical characteristics of the ceramic material, any one material among CaO, $Fe_2O_3$, Si, Ca, TiC, Fe, and Ti or a sintering aid made of a mixture of two or more thereamong may be added to the lower dielectric 10B within 30 wt %.

A concave groove is formed through machining in an upper surface of the lower dielectric 10B so as to install an electrode. The concave groove may be formed as a ringshaped groove 13B recessed in the lower dielectric 10B by as much as a thickness of the electrode. The ring-shaped groove 13B has a diameter that is smaller than a diameter of the lower dielectric 10B.

Figure 19:
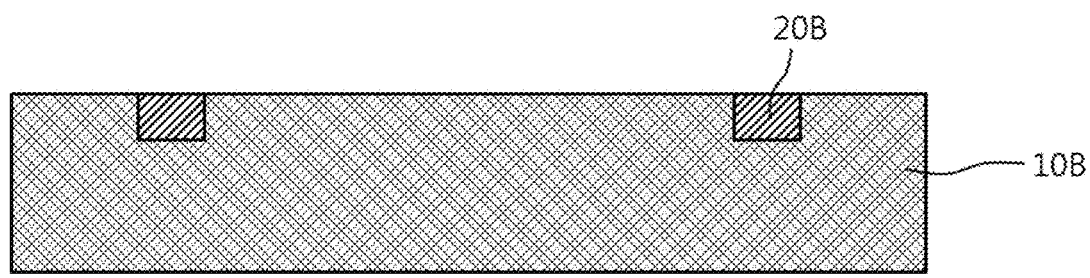
FIG. 19 is a cross-sectional view illustrating an electrode formed in the ring-shaped groove of the lower dielectric of FIG. 18.

Referring to FIG. 19, the ring-shaped groove 13B is filled with an electrode 20B, and the electrode 20B is fixedly installed in the lower dielectric 10B. The electrode 20B may be made of any one material among Ag, Pd, Pt, and W or a metal mixture of two or inure thereamong, and the electrode 20B may be formed to have a thickness ranging from 2 μm to 10 μm. The upper surface of the lower dielectric 10B in which the electrode 20B is installed in the ring-shaped groove 13B is planarized.

Figure 20:
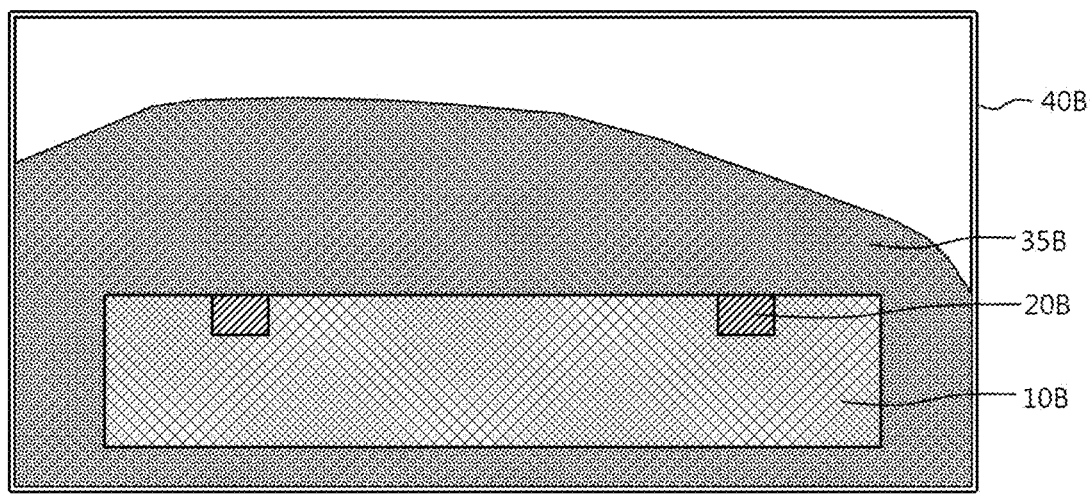
FIG. 20 is a cross-sectional view illustrating the lower dielectric of FIG. 19 and a capsule filled with a treated powder.

Referring to FIG. 20, the lower dielectric 10B in which the electrode 20B is formed is put into a capsule 40B, a treated powder 35B fills the capsule 40B to surround the entirety of outer surfaces of the lower dielectric 10B and the electrode 20B, and then the capsule 40B is sealed. The capsule 40B may be formed of a metal, glass, or a thermally conductive material including ceramics.

The treated powder 35B is prepared by compressing and molding a powder of the same material as the lower dielectric 10B, and an average particle diameter (D50) of the treated powder 35B ranges from 0.1 μm to 100 μm. For example, the treated powder 35B may be made of any one material among $Al_2O_3$, MgO, $Zr_2O_3$, $Zn_2O$, $Y_2O_3$, $SiO_2$, AlN, and $Si_3N_4$ or a ceramic material made of a mixture of two or more thereamong by forming the material or the ceramic material in the form of a powder. In addition, in order to enhance electrical and mechanical characteristics of the ceramic material, any one material among CaO, $Fe_2O_3$, Si, Ca, TiC, Fe, and Ti or a sintering aid made of a mixture of two or more thereamong may be added to the treated powder 35B within 30 wt %.

Sintering heat treatment is performed on the sealed capsule 40B, and the described above heat treatment equipment 100 of FIG. 7 may be used for the sintering heat treatment.

When the sintering heat treatment is completed, the sealed capsule 40B is unloaded and disassembled. A treated sintered body in which the treated powder 35B is bonded to the lower dielectric 10B and the electrode 20B due to the sintering heat treatment is unloaded from the capsule 40B, and then the treated sintered body is cut using a cutting tool to form a chuck body 1B.

Figure 21:
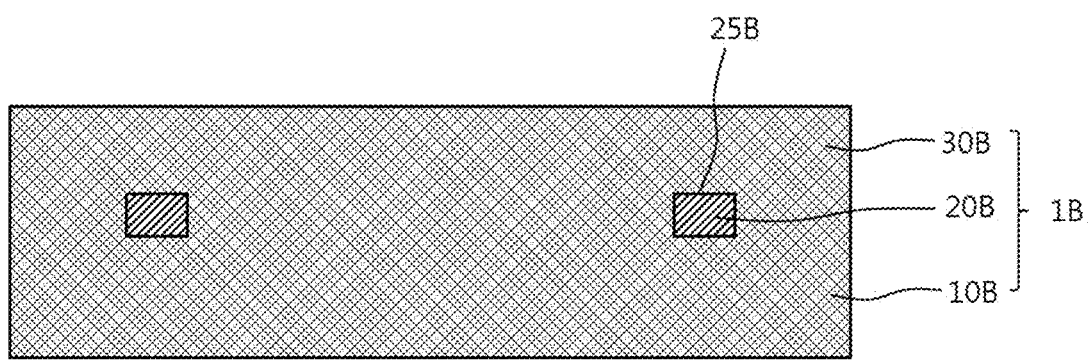
FIG. 21 is a cross-sectional view illustrating a chuck body obtained by heat-treating and post-processing the capsule of FIG. 20 using the heat treatment equipment.

As shown in FIG. 21, after the cutting process is completed, the chuck body 1B has a structure in which the electrode 20B is buried and installed between the lower dielectric 10B and an upper dielectric 30B, and the structure is implemented such that the treated powder 35B is diffused on and bonded to the surfaces of the lower dielectric 10B and the electrode 20B due to the sintering heat treatment so as to form the upper dielectric 30B forming an upper portion of the chuck body 1B. As described above, due to the performance of the sintering heat treatment by applying an isostatic pressure, an interface 25B between the electrode 20B and the upper dielectric 30B has an excellent interface characteristic.

Figure 22:
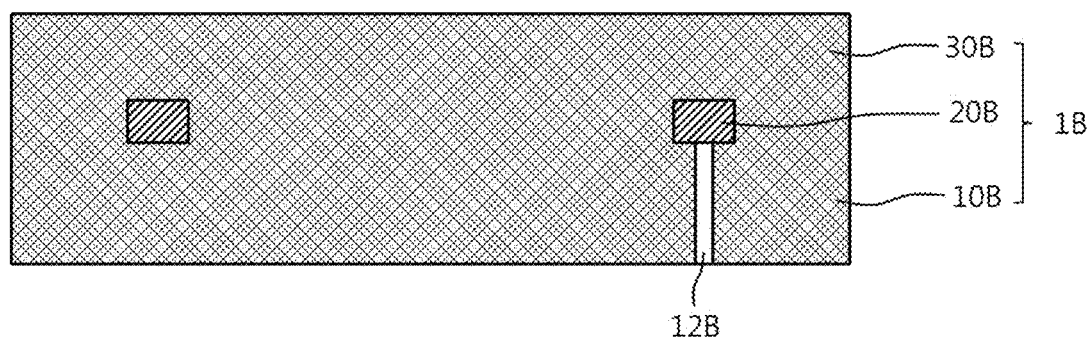
FIG. 22 is a cross-sectional view illustrating that a through-hole is formed in the lower dielectric of the chuck body of FIG. 21.
Figure 23:
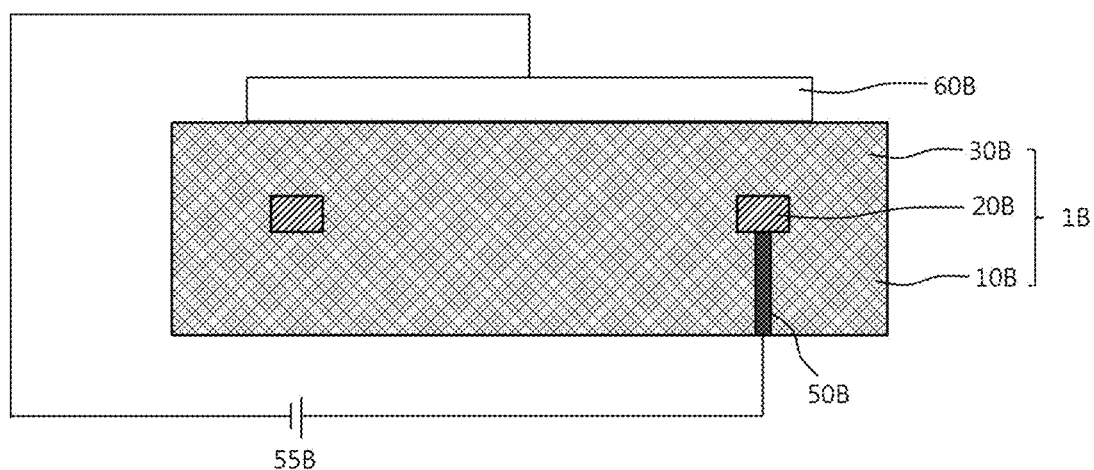
FIG. 23 is a diagram illustrating an ESC in which a contact portion of the chuck body of FIG. 22 is connected to a power source.

Thereafter, as shown in FIG. 22, a through-hole 12B is formed in the lower dielectric 10B so as to partially expose the electrode 20B buried and installed between the lower dielectric 10B and the upper dielectric 30B. Then, as shown in FIG. 23, an electrode rod is installed in the through-hole 12B to form a contact portion 50B, and a power source 55B is connected to the contact portion 50B. Accordingly, an operation of an ESC for suctioning and fixing a workpiece 60B (a wafer or a glass substrate) placed on a surface of the upper dielectric 30B using an electrostatic force may be performed.

EXPERIMENTAL EXAMPLE (a) As a lower dielectric, a concave groove for electrode installation was machined in an alumina plate, and a metal electrode was fixedly installed in the processed concave groove. The metal electrode was capable of being made of any one material among Ag, Pd, Pt, and W or a metal mixture of two or more thereamong, and the metal electrode 20B had a thickness ranging from 2 μm to 10 μm.

(b) A capsule made of a metal material and hawing a shape similar to a shape of a chuck body of an ESC was manufactured, and the capsule was filled with the alumina plate, in which the metal electrode was fixedly installed, and an alumina powder covering the alumina plate and was sealed with vacuum treatment. An average particle diameter (D50) of the alumina powder ranged from 0.1 μm to 100 μm.

(c) The sealed capsule was placed in a heat treatment equipment and sintering heat treatment was performed on the sealed capsule under the following process conditions.
  isostatic pressure: 2000 bar
  heat treatment temperature: 1350° C.
  heat treatment time: two hours (d) When the sintering heat treatment was completed, the capsule was disassembled, the treated sintered body was unloaded, and a prototype of the chuck body of the ESC was manufactured by cutting the treated sintered body into a chuck body shape through a cutting process.

COMPARATIVE EXAMPLE 1

Sintering heat treatment was performed using an alumina plate, a metal electrode, and an alumina powder which are the same as in Experimental Example 1. However, the sintering heat treatment was carried out using a reaction chamber for sintering heat treatment without using a heat treatment equipment, which was capable of applying an isostatic pressure, and a capsule.
  heat treatment pressure: 2000 bar
  heat treatment temperature: 1350° C.
  heat treatment time: two hours

21 COMPARATIVE EXAMPLE 2

Sintering heat treatment was performed such that a metal electrode was placed between two sapphire plates. However, the sintering heat treatment was carried out using a reaction chamber for sintering heat treatment without using a heat treatment equipment, which was capable of applying an isostatic pressure, and a capsule,
  heat treatment pressure: 2000 bar
  heat treatment temperature: 1350° C.
  heat treatment time: two hours Table 1 below shows variations in weight of the chuck bodies of the ESCs, which were manufactured by Experimental Example, Comparative Example 1, and Comparative Example 2, due to an etching process in a plasma environment.

TABLE 1

|  | Weight before etching process (g) | Weight after etching process (g) | Weight difference (g) |
| --- | --- | --- | --- |
| Comparative Example 1 | 0.78657 | 0.78506 | 0.00151 |
| Comparative Example 2 | 0.81026 | 0.80880 | 0.00146 |
| Experimental Example | 0.52545 | 0.52412 | 0.00133 |

In Table 1, Experimental Example exhibited that, when a plasma etching process was performed, the variation in weight of the chuck body was 0.00133 which was the smallest variation and indicated high plasma resistance.

Table 2 below shows hardness and specific gravity of each of the chuck bodies of the ESCs manufactured by Experimental Example, Comparative Example 1, and Comparative Example 2.

TABLE 2

|  | Hardness (Hv) | Specific gravity |
| --- | --- | --- |
| Comparative Example 1 | 1779 | 3.9269 |
| Comparative Example 2 | 1899 | 3.9876 |
| Experimental Example | 1947 | 3.9705 |

In Table 2, <Experimental Example> exhibited the highest hardness of the chuck body as 1947 Hv, and the specific gravity of 3.9705 was close to the specific gravity of 3.965 of ideal single crystalline alumina (sapphire) and exhibited that residual pores were very few.

Figure 24A:
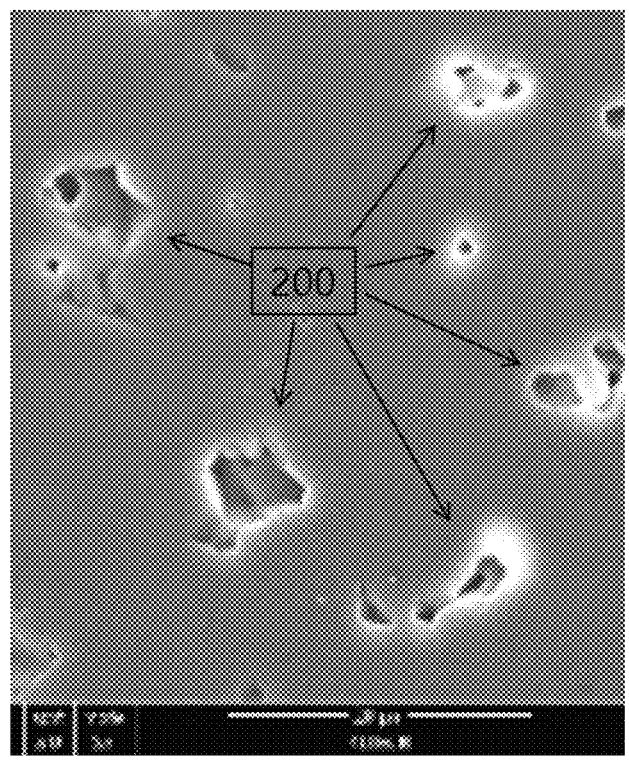
FIG. 24A to FIG. 24C show enlarged images illustrating each sintered body according to a heat treatment method and a type of a material.
Figure 24B:
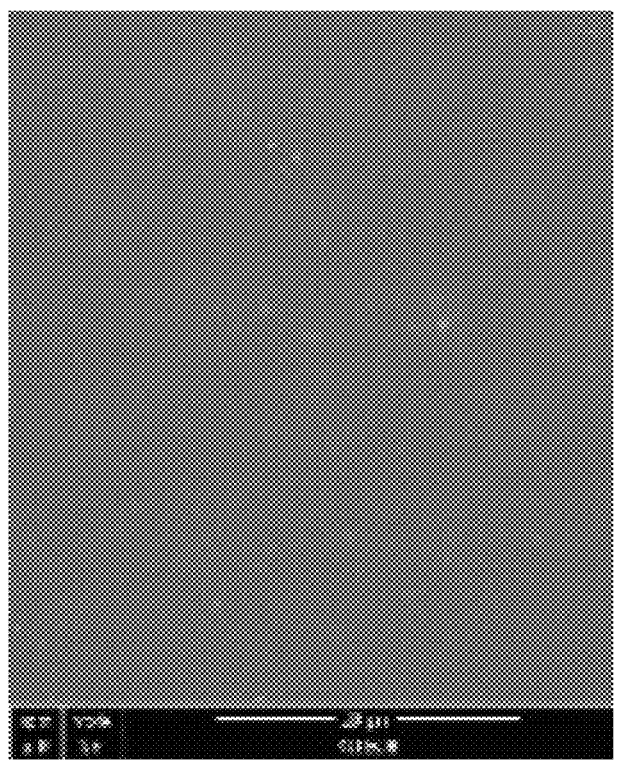
Figure 24C:
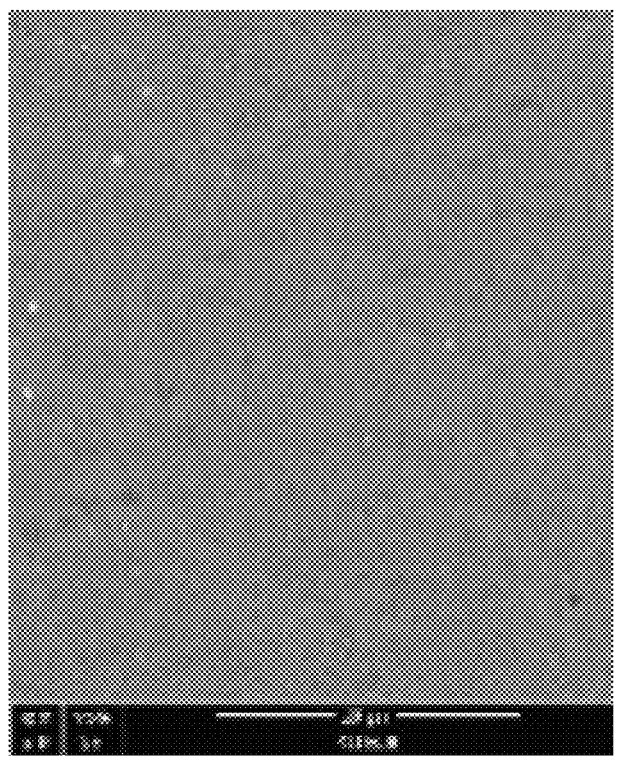

FIG. 24A to FIG. 24C show enlarged images illustrating each sintered body according to a heat treatment method and a type of a material, FIG. 24A is an image illustrating a sintered body obtained by Comparative Example 1, FIG. 24B is an image illustrating a sintered body obtained by Comparative Example 2, and FIG. 24C is an image illustrating a sintered body obtained by Experimental Example.

It can be confirmed that coarse inner pores 200 remain in the sintered body in FIG. 24A, but coarse inner pores do not remain in the sintered body in FIGS. 24B and 24C.

Figure 25A:
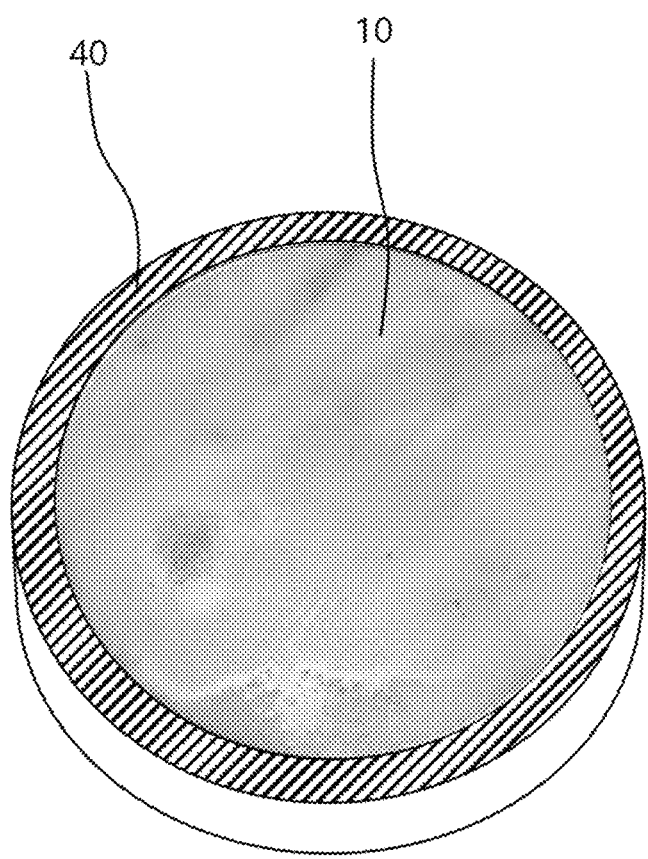
FIG. 25A and FIG. 25B show images illustrating a prototype manufactured by the method of manufacturing an ESC according to an embodiment of the present invention.
Figure 25B:
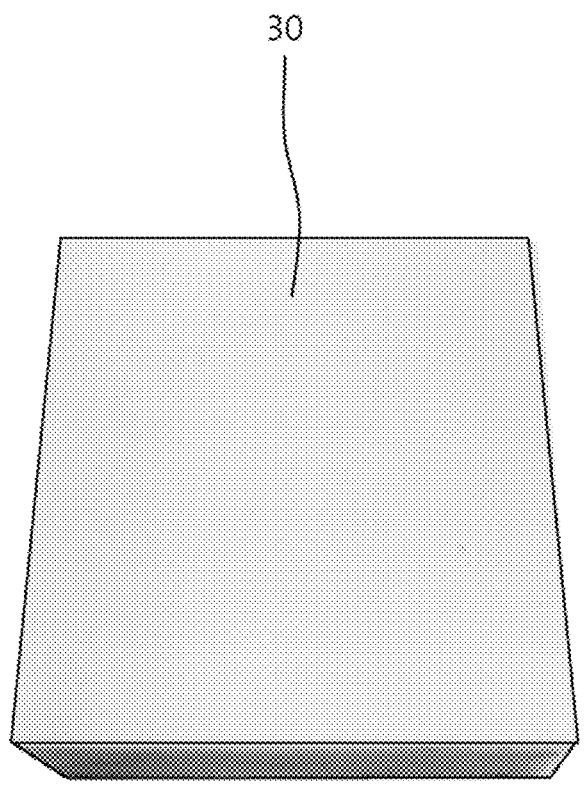

FIG. 25A and FIG. 25B show images illustrating a prototype manufactured by the method of manufacturing an ESC according to an embodiment of the present invention.

FIG. 25A shows a cross section of the capsule 40 undergoing sintering heat treatment in the heat treatment equipment 100 after being unloaded from the heat treatment equipment 100 and cut vertically and is an image illustrating the capsule 40 filled with the lower dielectric 10. FIG. 25B is an image illustrating the upper dielectric 30 of the chuck body which is processed through disassembly of the capsule 40 and the cutting process.

In the above-described embodiments, although the ESC for suctioning and fixing a workpiece using an electrostatic force has been illustratively described as a dielectric substance-electrode assembly, the present invention is not limited thereto, and a target of the dielectric substance-electrode assembly may include a ceramic member for equipment parts that are usable for a long period of time in high-power and high-temperature environments. For example, in order to form an atmosphere at a temperature of 400° C. or higher, which is essential for photoresist (PR) coating and etching of a semiconductor wafer, the present invention can be applied to the manufacture of an electrode heater buried-type ceramic member in which a buried electrode is printed as a resistance pattern and then assembled with a dielectric, thereby being capable of generating heat.

In accordance with the present invention, since sintering heat treatment is performed by applying an isostatic pressure in a state in which a capsule filled with a treated powder and a lower dielectric, on which an electrode is formed, is placed in a pressure vessel of a heat treatment equipment, it is possible to suppress pores remaining inside a sintered body.

In accordance with the present invention, since the treated powder can be diffused on and bonded to surfaces of the lower dielectric and the electrode due to the sintering heat treatment so as to form an upper dielectric, a dielectric substance-electrode assembly with an excellent interface characteristic and high plasma resistance can be manufactured.

The above-described description of the present invention is intended only for an illustrative purpose, and it can be easily understood that other concrete forms can be devised by those skilled in the art without changing or modifying the technical spirit or essential characteristics of the present invention.

What is claimed is:

1. A dielectric substance-electrode assembly comprising:
   a lower dielectric forming a lower portion of an assembly body;
   an electrode formed on the lower dielectric, wherein the electrode extends from a surface of the lower dielectric; and
   an upper dielectric forming an upper portion of the assembly body, the upper dielectric formed from a treated powder which is in contact with and bonded to a primary surfaces and a sidewall surface of the electrode that extends from the surface of the lower dielectric, and a surface of the lower dielectric, as a result of a sintering heat treatment, the heat treatment including applying an isostatic pressure to a capsule,
   wherein the capsule, which contains a stacked arrangement of a plurality of lower dielectric and electrode units spaced apart from each other, and the treated powder occupies a space between the stacked plurality of lower dielectric and electrode units, is sealed, and the sealed capsule is subject to the sintering heat treatment in a pressure vessel of heat treatment equipment,
   wherein the dielectric substance-electrode assembly is separated from the sintered stack.

2. The dielectric substance-electrode assembly of claim 1, wherein:
   the lower dielectric and the upper dielectric are formed of the same material; and
   the treated powder is prepared by compressing and molding a powder of the same material as the lower dielectric.

3. The dielectric substance-electrode assembly of claim 2, wherein an average particle diameter (D50) of the treated powder ranges from 0.1 μm to 100 μm.

4. The dielectric substance-electrode assembly of claim 1, wherein the isostatic pressure applied to the capsule in the pressure vessel ranges from 1000 bar to 3000 bar.

5. The dielectric substance-electrode assembly of claim 1, wherein the sintering heat treatment of the sealed capsule ranges from 1300° C. to 1700° C., and a heat treatment time is 30 minutes or more.

6. The dielectric substance-electrode assembly of claim 1, wherein each of the lower dielectric and the upper dielectric includes $Al_2O_3$, $MgO$, $Zr_2O_3$, $Zn_2O$, $Y_2O_3$, $SiO_2$, $AlN$, or $Si_3N_4$, or a ceramic material made of a mixture of two or more of $Al_2O_3$, $MgO$, $Zr_2O_3$, $Y_2O_3$, $SiO_2$, $AlN$, or $Si_3N_4$.

7. The dielectric substance-electrode assembly of claim 6, wherein each of the lower dielectric and upper dielectric further comprises $CaO$, $Fe_2O_3$, $Si$, $Ca$, $TiC$, $Fe$, or $Ti$, or a mixture of two or more of $CaO$, $Fe_2O_3$, $Si$, $Ca$, $TiC$, $Fe$, or $Ti$, in an amount of 30 wt % or less.

8. The dielectric substance-electrode assembly of claim 1, wherein the electrode is Ag, Pd, Pt, or W or a metal alloy thereof.

9. The dielectric substance-electrode assembly of claim 1, wherein the electrode has a thickness of from 2 μm to 10 μm.

10. The dielectric substance-electrode assembly of claim 1, wherein the electrode is formed in the lower dielectric by a screen printing method, a drop casting method, a physical vapor deposition (PVD) method, a chemical vapor deposition (CVD) method, or a thermal spraying coating method.

11. The dielectric substance-electrode assembly of claim 1, wherein the heat treatment equipment includes:
   an insulated accommodation space for the pressure vessel;
   an upper cover configured to attach to an open upper portion of the pressure vessel, and in which gas is introduced via a gas inlet into the accommodation space; and
   a heater configured to heat the accommodation space surrounded by the insulating member.

12. The dielectric substance-electrode assembly of claim 1, wherein the dielectric substance-electrode assembly is any one of an electrostatic chuck (ESC) and an electrode heater buried-type ceramic member.

13. The dielectric substance-electrode assembly of claim 1, wherein the dielectric substance-electrode assembly is electrostatic chuck (ESC) or an electrode heater buried-type ceramic.

14. A method of manufacturing a dielectric substance-electrode assembly, the method comprising:
   forming a lower dielectric;
   forming an electrode on the lower dielectric, wherein the electrode extends from a surface of the lower dielectric;
   forming a stacked arrangement of a plurality of lower dielectric electrode units spaced apart from each other, wherein a treated powder fills a space between the stacked plurality of lower dielectric electrode units within a sealed capsule, and forming an upper dielectric of the assembly body from the treated powder by performing sintering heat treatment at an isostatic pressure of the sealed capsule placed within a heat treatment equipment, wherein the upper dielectric bonds to a surface of the lower dielectric and the electrode due to the sintering heat treatment, and separating the dielectric substance-electrode assembly from the sintered stack.

15. The method of claim 14, wherein:
the lower dielectric and the upper dielectric are formed of the same material; and
the treated powder is prepared by compressing and molding a powder of the same material as the lower dielectric.

16. The method of claim 15, wherein an average particle diameter (D50) of the treated powder ranges from 0.1 μm to 100 μm.

17. The method of claim 14, wherein the isostatic pressure applied to the capsule in the pressure vessel ranges from 1000 bar to 3000 bar, a temperature of the sintering heat treatment performed on the capsule ranges from 1300° C. to 1700° C., and a heat treatment time is 30 minutes or more.

18. The method of claim 14, wherein each of the lower dielectric and the upper dielectric includes any one material among $Al_2O_3$, MgO, $Zr_2O_3$, $Zn_2O$, $Y_2O_3$, $SiO_2$, AlN, and $Si_3N_4$, or a ceramic material made of a mixture of two or more thereamong.

19. The method of claim 18, wherein any one material among CaO, $Fe_2O_3$, Si, Ca, TiC, Fe, and Ti or a sintering aid made of a mixture of two or more thereamong is added to each of the lower dielectric and upper dielectric within 30 wt %.

20. The method of claim 14, further comprising forming a concave groove corresponding to a shape of the electrode in the lower dielectric, the electrode disposed in the concave groove.

21. The method of claim 20, wherein:
the concave groove is formed as a circular plate-shaped groove or a ring-shaped groove; and
the concave groove is recessed to a predetermined depth.

22. The method of claim 14, wherein the forming of the electrode comprises a screen printing method, a drop casting method, a physical vapor deposition (PVD) method, a chemical vapor deposition (CVD) method, or a thermal spraying coating method.

23. The method of claim 14, wherein the electrode is Ag, Pd, Pt, or W or a metal alloy thereof, and has a thickness ranging from 2 μm to 10 μm.

24. The method of claim 14, the separating of each of the dielectric substance-electrode assembly comprises cutting from the sintered stacked arrangement.

25. The method of claim 24, further comprising:
forming a through-hole in the lower dielectric to partially expose the electrode of the plurality of separated dielectric substance-electrode assembly; and
installing an electrode rod for electrical connection to the electrode in the through-hole to form a contact portion.

* * * * *